United States Patent [19]
King et al.

[11] 3,737,983
[45] June 12, 1973

[54] AUTOMATED METHOD AND SYSTEM FOR FABRICATING SEMICONDUCTOR DEVICES

[75] Inventors: Lewic C. King, Dallas; Gerald A. Yearsley, Garland; Anthony L. Adams, Dallas; Marion I. Simmons, Richardson; Eugene G. Altenburger; Billy P. Yager, both of Dallas, all of Tex.

[73] Assignee: Texas Instruments, Incorporated, Dallas, Tex.

[22] Filed: June 14, 1971

[21] Appl. No.: 153,064

Related U.S. Application Data

[62] Division of Ser. No. 837,843, June 30, 1969, Pat. No. 3,618,191.

[52] U.S. Cl. .......... 29/574, 29/588, 29/593
[51] Int. Cl. .......... B01j 17/00
[58] Field of Search .......... 29/590, 591, 589, 29/574, 576, 594; 228/4, 6; 65/138, 137, 140

[56] References Cited

UNITED STATES PATENTS

| | | | |
|---|---|---|---|
| 3,439,235 | 4/1969 | Lanzl et al. | 29/590 X |
| 3,235,937 | 12/1966 | Lanzl et al. | 29/589 X |
| 3,298,087 | 1/1967 | Hunt | 29/588 |
| 3,337,941 | 8/1967 | Drop | 29/208 CX |
| 3,276,854 | 10/1966 | Felker et al. | 29/591 X |

*Primary Examiner*—Charles W. Lanham
*Assistant Examiner*—W. Tupman
*Attorney*—James B. Hinson

[57] ABSTRACT

An automatic method and system for packaging discrete semiconductor devices such as transistors is described. The system includes a chasis for indexing a plurality of chucks past a series of work stations. The work stations include three wire loading stations for loading flat-headed lead wires in the chucks, a glass loading station for placing a glass ring around the necks of the lead wires, a series of heaters for heating the glass rings, a pair of molding stations for molding the heated glass rings around the necks of the lead wires to form a header, an alloy station for placing the semiconductor devices in a predetermined orientation on the head of one of the lead wires, and a series of automatic bonding stations for connecting the base and emitter contacts of the semiconductor devices to the heads of the other lead wires.

The overall system is controlled by a digital computer. Stations are provided for detecting the absence of a lead wire, the absence of a glass ring, or the absence of a transistor device. The system also detects failure of any one of the bonder stations and terminates operation of the system. The computer is programmed to provide shift registers which define each index position of the chasis and logic signals are shifted through the shift register to continually locate any chuck which is defectively loaded so as to prevent the successful completion of a header assembly. The computer then disables each subsequent station as the defectively loaded chuck is positioned at the respective station.

5 Claims, 17 Drawing Figures

AUTOMATED METHOD AND SYSTEM FOR FABRICATING SEMICONDUCTOR DEVICES

This Application is a division of Application Ser. No. 837,843, filed June 30, 1969, now U. S. Letters Patent No. 3,618,191, issued Nov. 9, 1971.

This invention relates generally to methods and apparatus for manufacturing semiconduction devices, and more particularly relates to a method for packaging a discrete semiconductor device that is adapted for automation, and to an automated system for practicing the method.

In a typical process for manufacturing a semiconductor device, such as a transistor, a large number of the devices are formed on a slice of semiconductor material nominally about one inch in diameter. The substrate typically forms the collectors of the transistors. A first diffusion is made into preselected regions of the substrate to form the base regions, and a second diffusion is made to form the emitter regions. A thin metal layer is then vapor deposited over the entire slice and selectively removed to leave individual expanded metal contacts for the base and collector regions of each discrete transistor. The slice is then divided into chips typically on the order of 0.020 inch square, each chip being a discrete transistor.

At an early date in the fabrication of transistors, these chips were alloyed to a metal header. The header was usually electrically connected directly to a metal lead and thus provided electrical connection to the emitter. Two additional leads passed through the header and were electrically isolated from the header by hermetic glass seals. The base and emitter regions were then connected to these isolated leads by gold jumper wires thermocompression ball bonded to the expanded contacts, and thermocompression stitch bonded to the respective leads. The header was then hermetically sealed in a controlled atmosphere by stitch welding a metal can over the header.

In more recent times, the semiconductor chips have been encapsulated in an epoxy, rather than in the hermetically sealed metallic cans. Examples of this type of process are described in U. S. Pats. Nos. 3,439,235 and 3,439,238. These processes are characterized in that the three lead wires are held by some suitable means while the semiconductor chip is alloyed to one lead wire and the expanded base and emitter contacts are connected to the others by the jumper wires. The semiconductor chip, jumper wires and the ends of the leads are then encapsulated in the epoxy by an injection molding process. These techniques represent significant cost savings when compared to the older methods employing the hermetically sealed metallic cans. However, these techniques are still being largely manually implemented and are not suitable for automation.

This invention is related to a method which is suitable for complete automation, and to the apparatus for automatically carrying out the method. In accordance with this invention, a header is formed by molding a glass body around three lead wires held in predetermined position and having flattened heads disposed in a common plane disposed at an angle to the leads. A semiconductor chip is then alloyed to the head of one of the leads, and the expanded contacts on the semiconductor device are electrically connected to the other leads by jumper wires. The glass header including the semiconductor device and jumper wires may then be encapsulated in plastic by an injection molding process of the type described in the above-referenced patents.

The system in accordance with the invention is capable of producing more than seven thousand devices per hour.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figures 1, 3A:
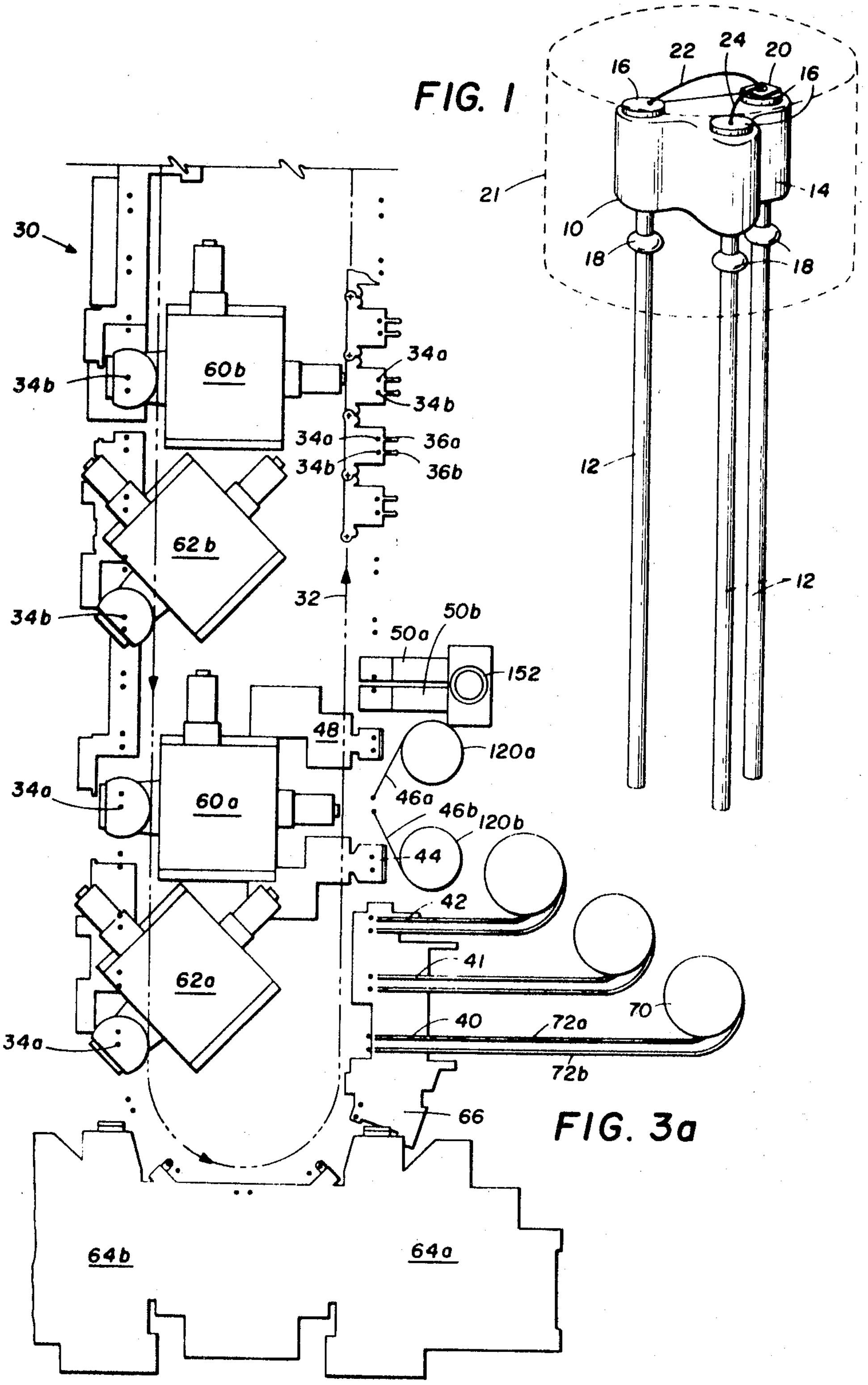
FIG. 1 is a perspective view of a typical transistor header assembly fabricated in accordance with the present invention.
Figure 3B:
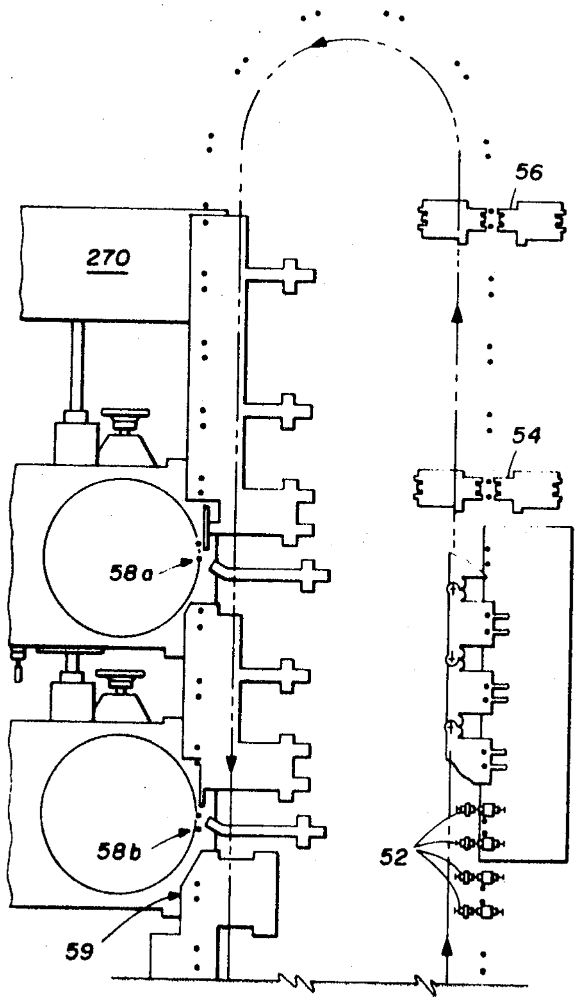
Figures 4, 4A:
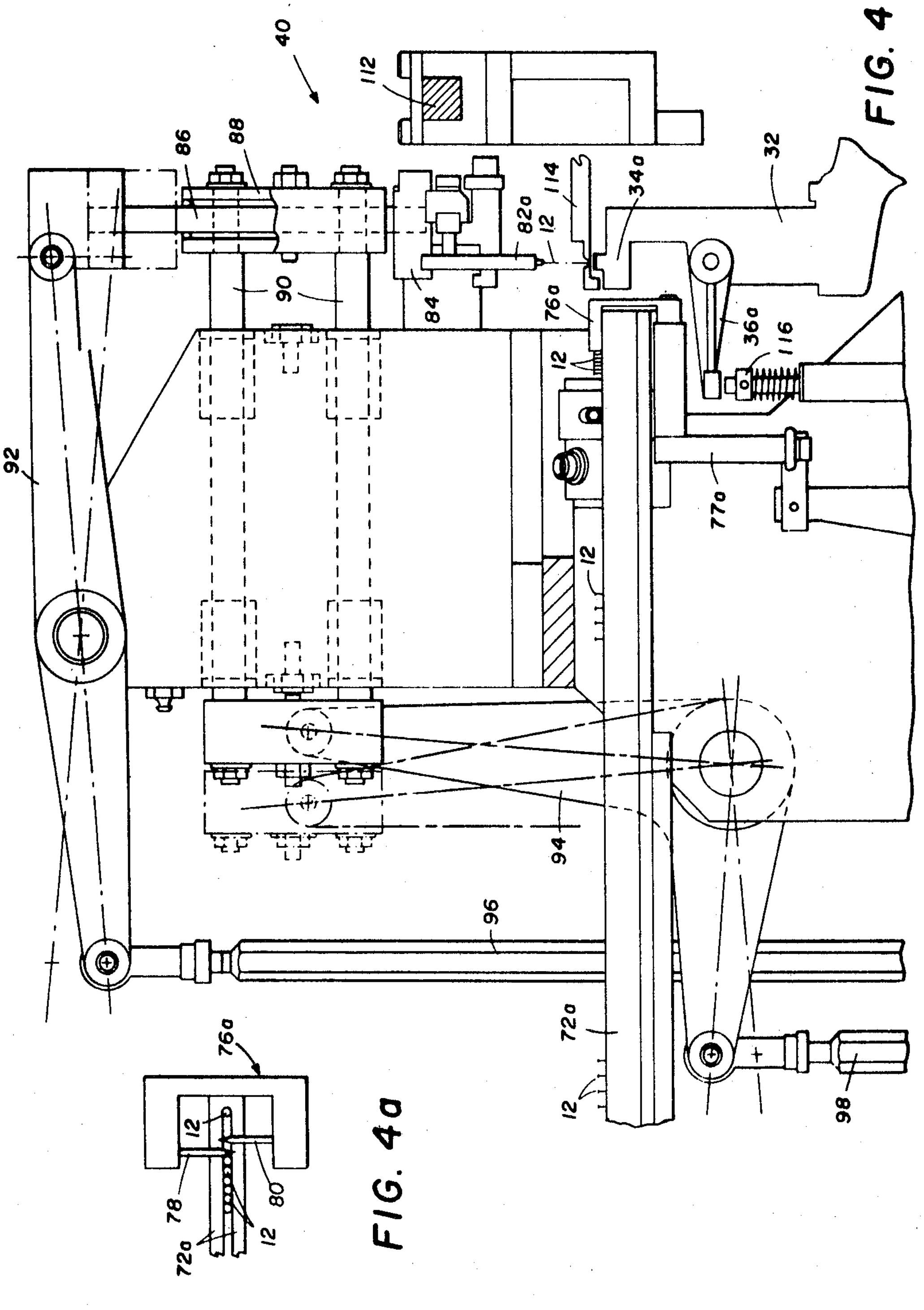
Figure 5:
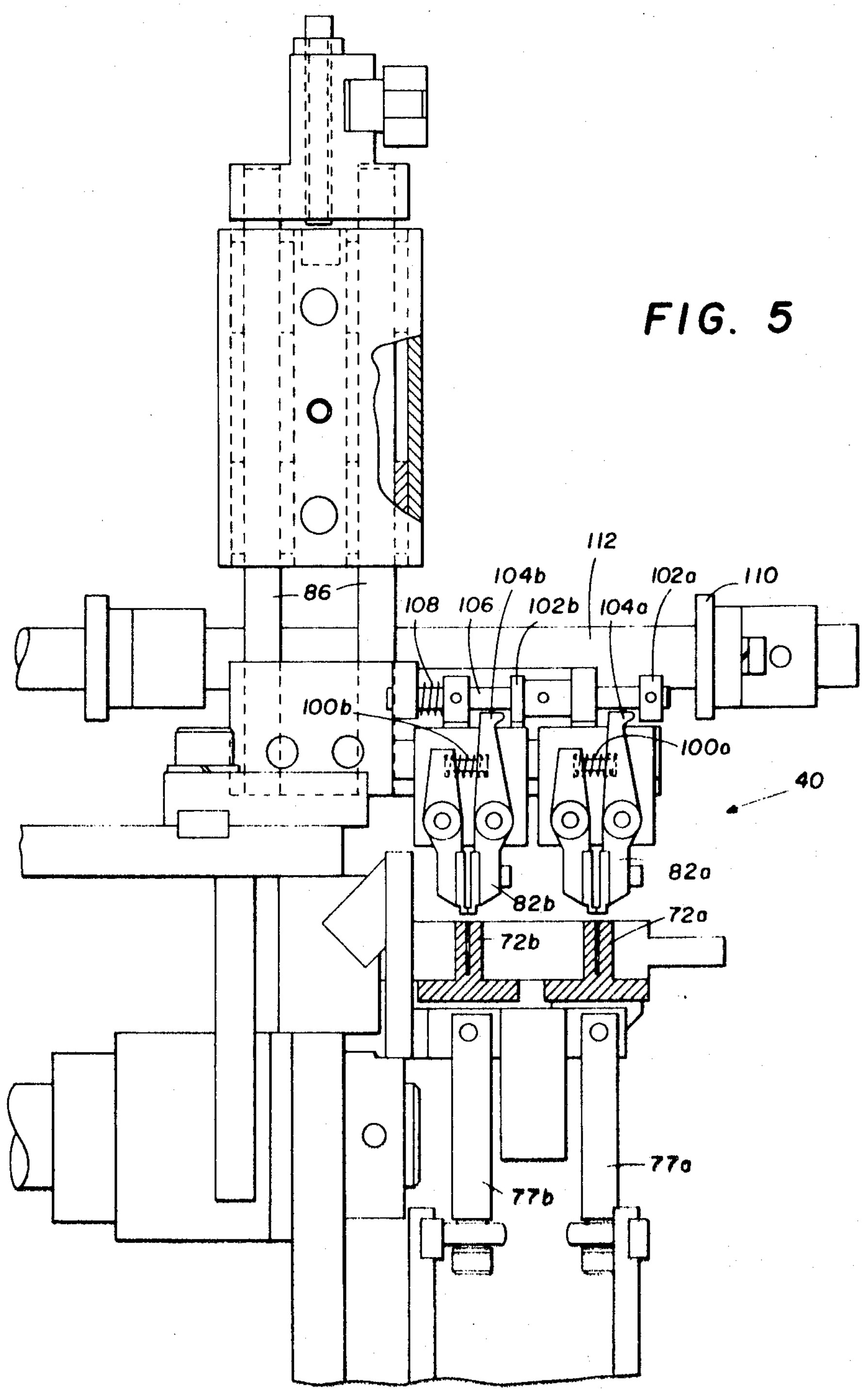
Figures 6, 8:
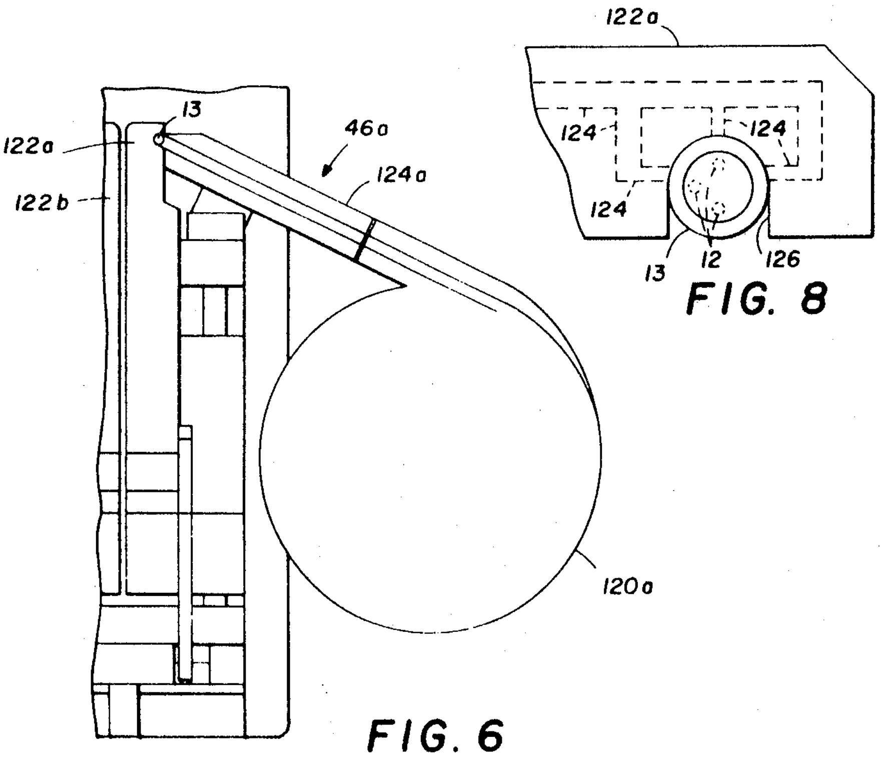

FIGS. *3a* and *3b*, taken together, are a simplified plan view of the mechanical portion of the system illustrated in FIG. 1;

FIG. 4 is a side elevational view of a wire loading station of the system of FIG. 3;

FIG. *4a* is a simplified plan view of the escapment system of the wire loading station of FIG. 4;

FIG. 5 is a side elevation of the wire loading station shown in FIG. 4;

FIG. 6 is a plan view of a glass loading station of the system shown in FIGS. *3a* and *3b;*

Figure 7:
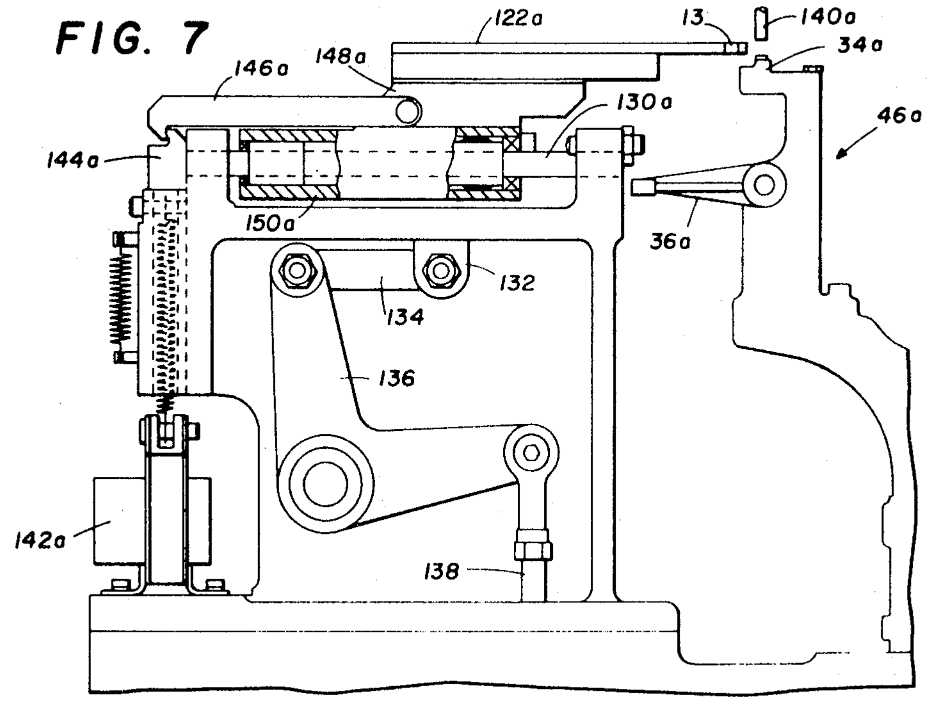
Figure 9:
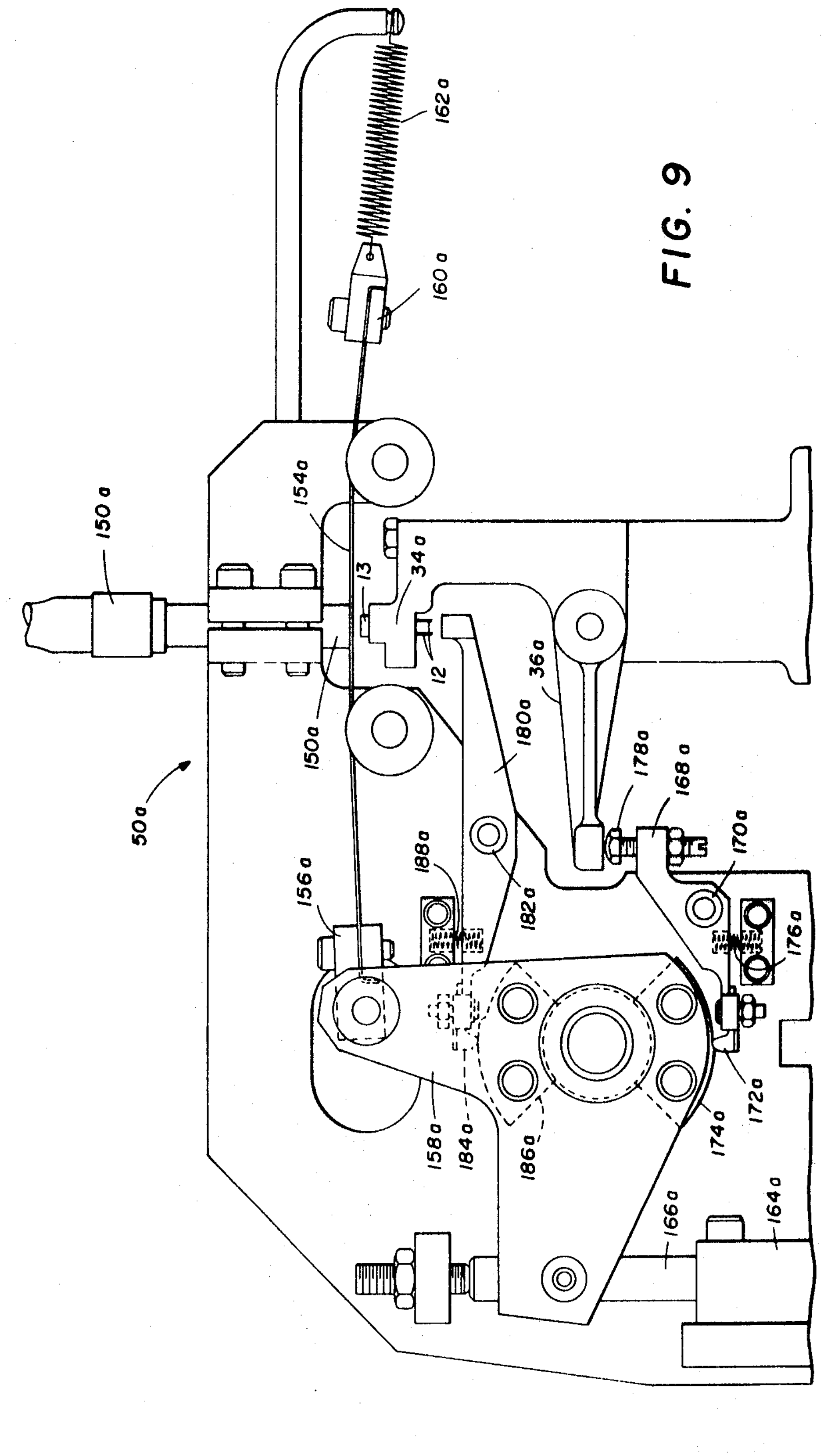
Figure 10:
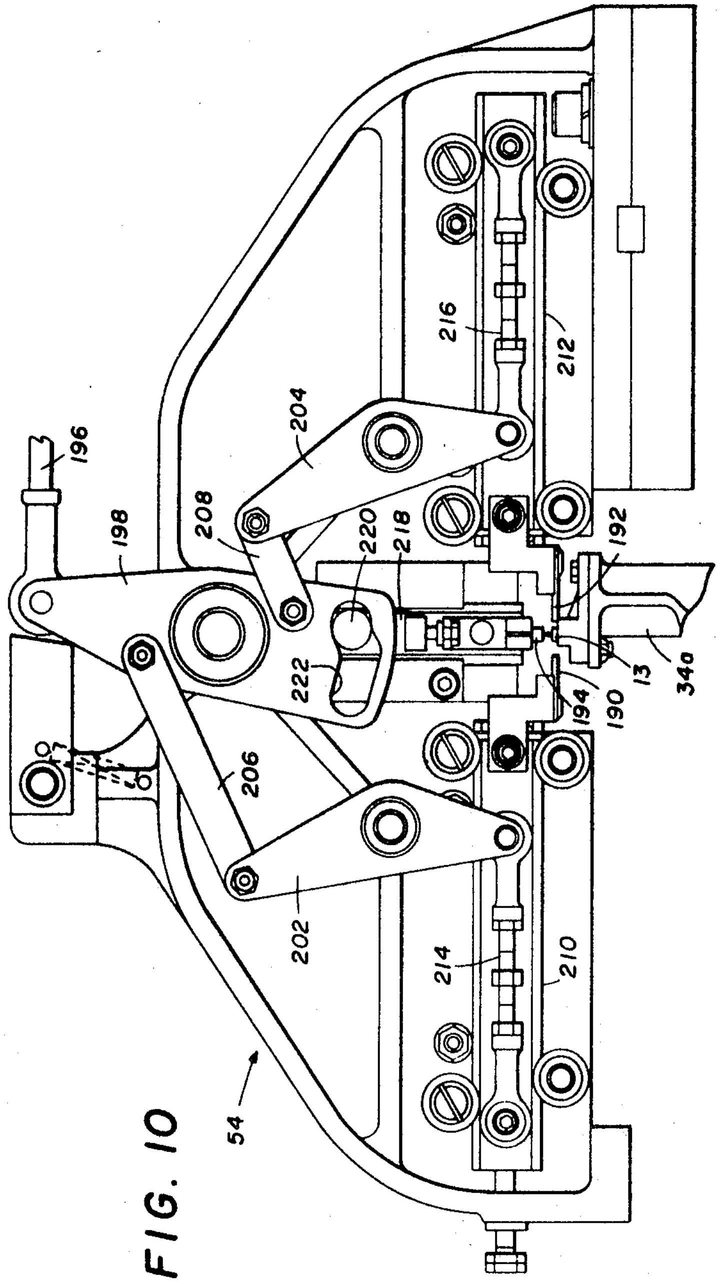
Figure 11:
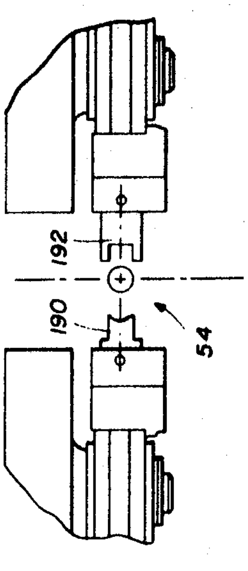
Figure 12:
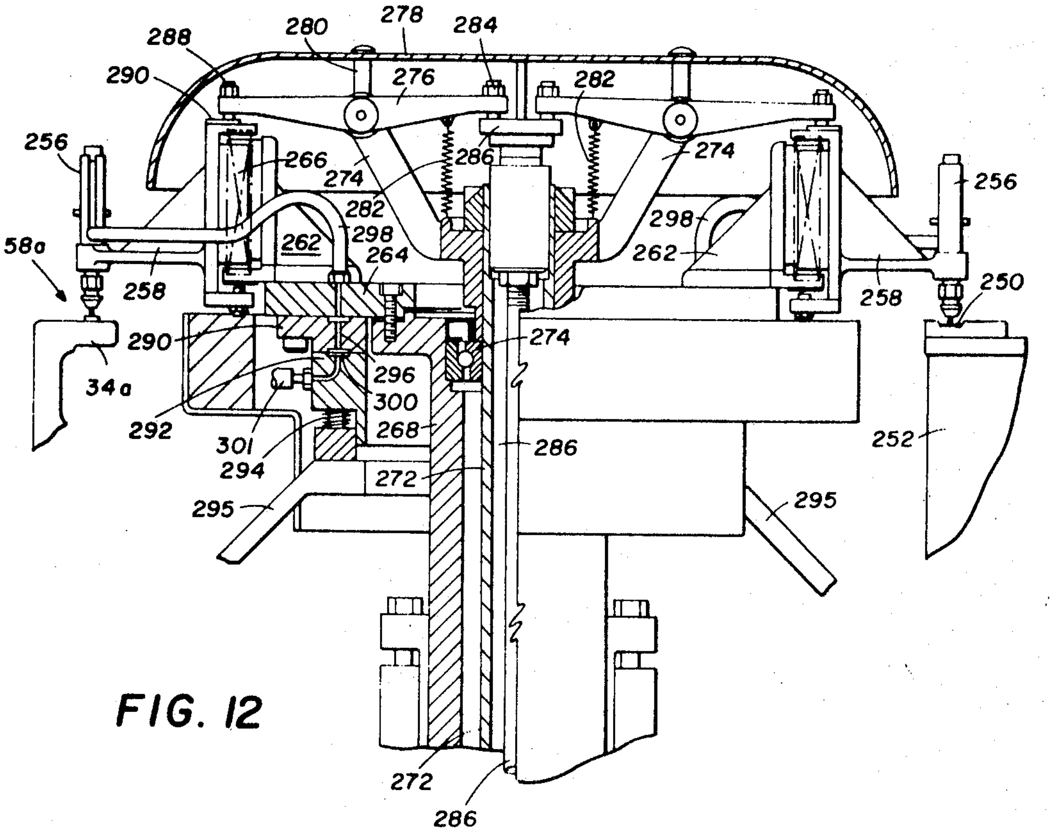

FIG. 7 is a side elevation of a portion of the glass loading station of FIG. 6;

FIG. 8 is an enlarged top view of a portion of the glass loading station shown in FIG. 6;

FIG. 9 is a side elevation of the vacuum station for removing parts from a defectively loaded chuck;

FIG. 10 is a side elevational view of a glass molding station;

FIG. 11 is a plan view of the dies of the glass molding station shown in FIG. 10;

FIG. 12 is a side elevation of an alloy station of the system of FIGS. *3a* and *3b;*

Figure 13:
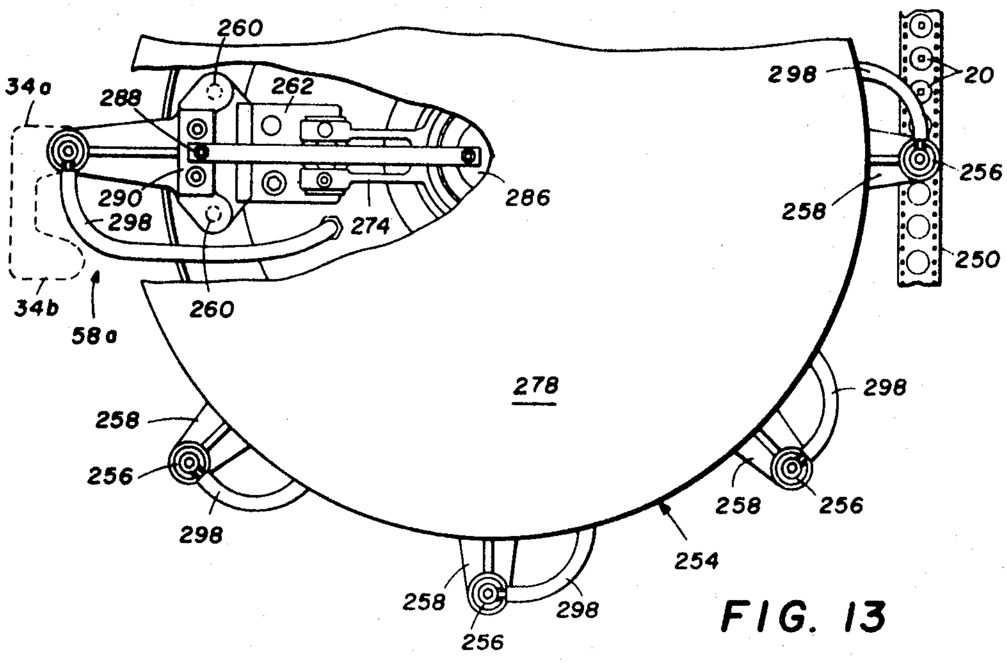
Figure 14:
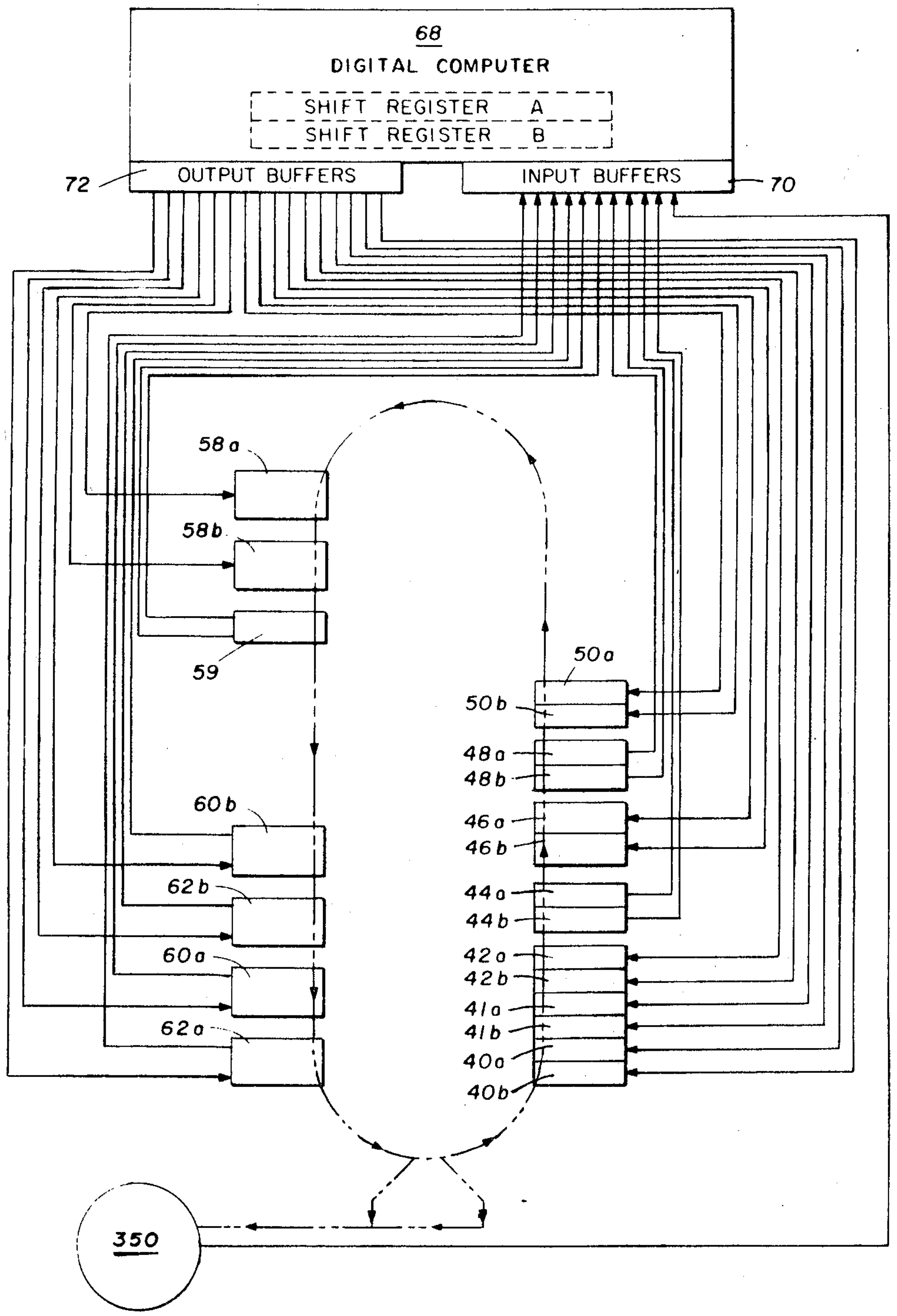
Figure 15:
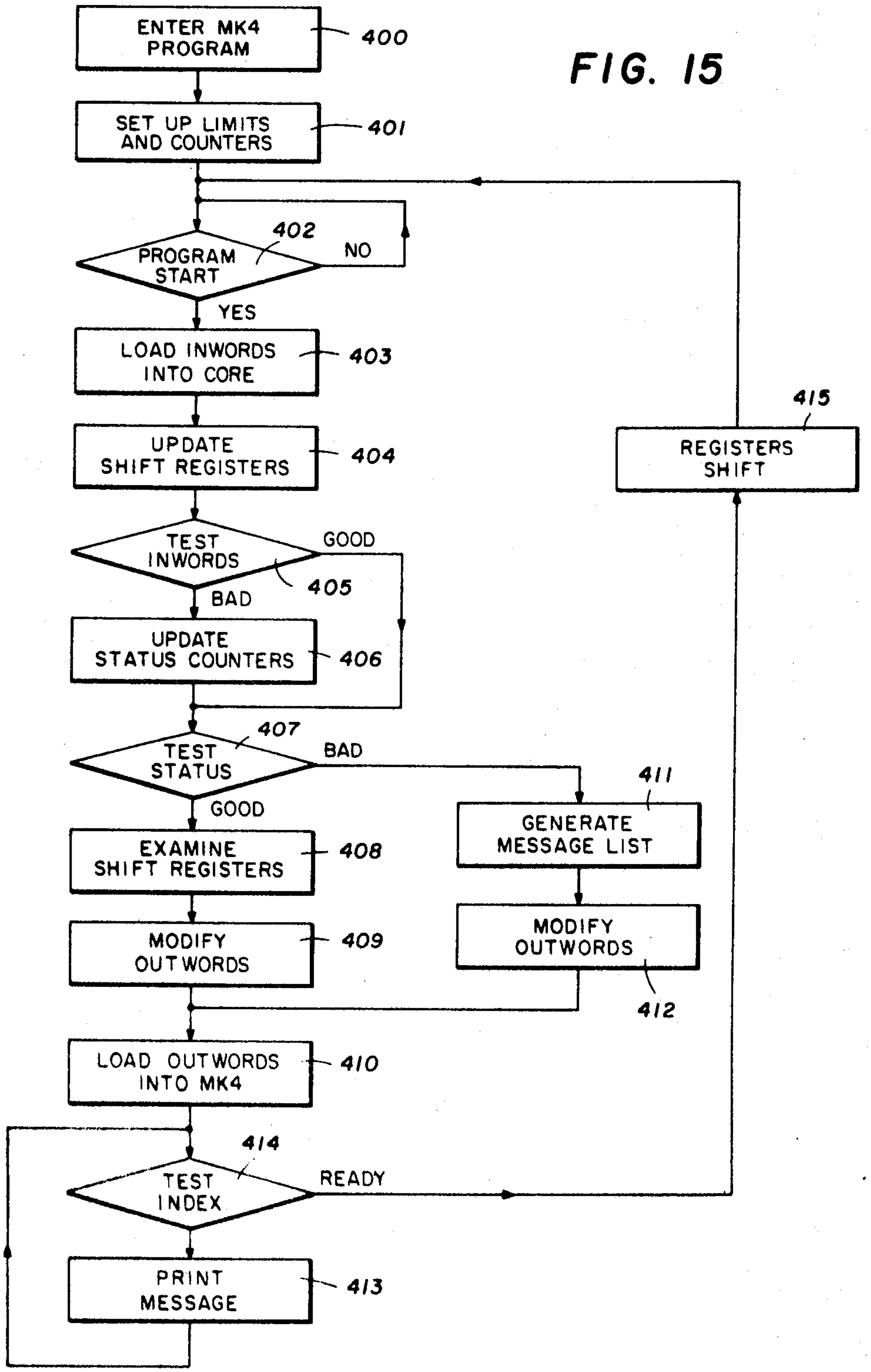

FIG. 13 is a partial top view of the alloy station of FIG. 12;

FIG. 14 is a schematic logic diagram of the computer control system for the apparatus of FIGS. *3a–3b;* and FIG. 15 is a flow chart of the program for the computer shown in FIG. 14.

Referring now to FIG. 1, a header assembly fabricated by the system of the present invention is indicated generally by reference numeral 10. The device 10 is comprised of three metal leads 12 held in fixed, parallel relationship by a body of glass 14. Each of the leads 12 has an enlarged flat head 16 and an enlarged bead portion 18. A semiconductor chip 20 is alloyed to the head of one of the leads 12. Although the chip illustrated is a transistor, it is to be understood that other semiconductor devices can be packaged by the method and system of this invention. A first jumper wire 22 interconnects an expanded contact on the semiconductor chip 20 and the head of one of the leads 12, and a second jumper wire 24 connects another expanded contact on the chip 20 and the head of the third lead wire 12. The header assembly 10 may then be encapsulated by an injection molded epoxy as in the patents above referenced, the plastic being represented in dotted outline 21.

Figure 2:
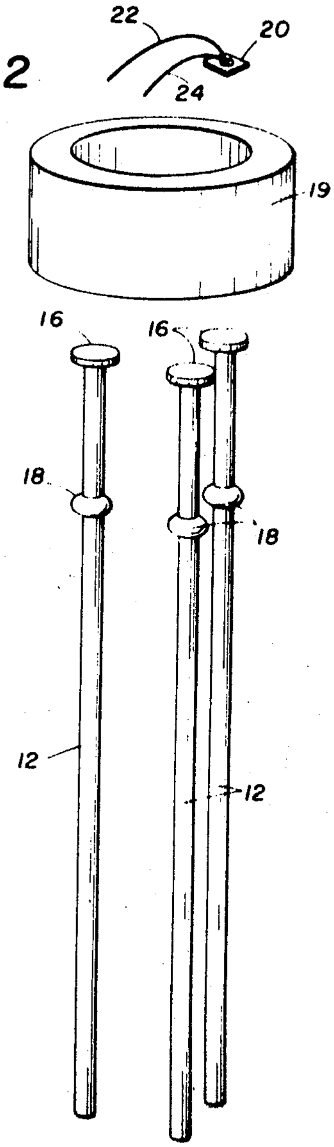
FIG. 2 is an exploded view of the components used by the system of this invention to fabricate the header assembly of FIG. 1.

The components from which the header assembly 10 is fabricated is shown in the exploded view of FIG. 2, which also represents the order in which the components are added to the structure.

The apparatus of the present invention is best illustrated in the plan view of FIGS. *3a* and *3b*. The apparatus, indicated generally by the reference numeral 30, includes a continuous chain 32 made up of a plurality of links each of which carries a pair of chucks **34*a* and 34*b*. The chain 32 is carried on an indexing chasis (not illustrated) of conventional design which indexes the chain precisely the length of one link during each indexing cycle. As a result, each of the chucks 34*a* and 34*b*** is successively positioned at the various "*a*" and "*b*" work stations, respectively, which will presently be described. In the embodiment illustrated, the chain is indexed at a rate of about seventy times per minute. Each of the chucks **34*a* and 34*b* has a pair of separable jaws, one stationary and one movable, which form apertures sized to receive and grip the three lead wires 12 below the enlarged portions 18 and thereby hold the lead wires in a predetermined relative position. The chucks 34*a* and 34*b* may be individually opened by applying an upward force to levers 36*a* and 36*b***, respectively.

The chucks **34*a* and 34*b* are successively indexed past three wire loading stations 40, 41, and 42. Each of the wire loading stations transfers a lead wire to each of the chucks 34*a* and 34*b*. Next the chucks are positioned at a wire detect station 44 where the absence of any one of the three wires in either of the chucks is detected. The lengths then pass a glass loading station 46 where a tubular ring of glass 19 is placed around the upper ends of the lead wires 12. The chucks are then indexed to a glass detect station 48 where the absence of a glass ring on either of the chucks is detected. The chucks next pass a vacuum reject station 50 where the contents of either chuck 34*a* or 34*b* can be emptied in the event any one of the wires 12 or the glass ring is detected as missing at detect stations 44 or 48.**

The chucks then proceed past a series of gas heaters 52 which impinge directly upon the glass ring. As the glass ring 19 is heated, it collapses around the lead wires 12. The chucks then pass first and second glass forming stations 54 and 56 which crimp the heated glass tightly around the lead wires 12 and complete the header construction.

The chucks **34*a* and 34*b* continue around the circular path and enter a heated tunnel 58 where the headers are heated to an alloying temperature preparatory to being positioned first at alloy station 58*a* where the semiconductor devices 20 are alloyed to the head of one of the lead wires 12 in the chucks 34*a*, and then at an alloy station 58*b* where a device 20 is alloyed to the lead in chuck 34*b*. The chucks are then positioned at an alloy detector station 59 where the absence of a chip on the header in either chuck 34*a* or 34*b* is detected. The chucks are then indexed past automatic bonding machines 60*b* and 62*b* which connect lead wires 22 and 24, respectively, to the header carried by chuck 34*b*, and then past bonders 60*a* and 62*a* which connect the wires 22 and 24 to the header carried by chuck 34*a***.

The chucks **34*a* and 34*b* are then indexed past transfer stations 64*a* and 64*b* which remove the completed header assemblies 10 from chucks 34*a* and 34*b* respectively. Finally, the chucks pass a dump station 66 where both chucks are automatically opened and cleaned preparatory to next stopping at the wire loading stations 40–42.**

The lead wire loading station 40 of FIG. *3a* includes a vibratory feeder bowl 70 which feeds the wires to a pair of vibratory tracks **72*a* and 72*b*. The vibratory feeders are of a design known in the art wherein the circular vibratory motion of the bowl moves the lead wires 12 upwardly along a spiral incline and the side wall of the bowl until the wires drop into a space between the rails 72*a* and between the rails 72*b*. The wires which fail to fall between the rails are returned to the bottom of the feeder bowl 70 and again moved up the spiral groove. The rails 72*a* and 72*b* are illustrated in cross section in FIG. 5, and the rails 72*a* are illustrated in the side elevation of FIG. 4.**

As the lead wires 12 are fed along the rails **72*a* and 72*b*, they accumulate behind an escapement mechanism 76*a* and 76*b* shown in FIG. 4. The escapement mechanism 76*a*** shown in detail in FIG. *4a* includes a pair of staggered needles 78 and 80 which are moved transversely of the rails **72*a*, first in one direction and then the other by drive mechanism 77*a* so that only one lead wire 12 can pass the escapement during each index cycle. The one lead wire 12 then drops into a hole which is subject to a vacuum to insure that it is accurately positioned for pickup by a pair of tweezers 82*a*. An identical escapement mechanism is provided for rails 72*b* to present a single lead wire to a second pair of tweezers 82*b* during each index cycle. The drive mechanisms 77*a* and 77*b*** are cam operated and can be selectively disabled by solenoids (not illustrated) which hold the cam followers (not illustrated) away from the cams.

The tweezers **82*a* and 82*b* are mounted on a carriage 84 which in turn is rigidly fixed to a pair of rods 86. The rods 86 are slidably mounted for vertical movement in a bracket 88 which in turn is fixed to the ends of a second pair of rods 90. The upper end of the rods 86 are mounted for sliding movement relative to a rocker arm 92. This arrangement permits the rods 90 to be reciprocated horizontally by a rocker arm 94 at the same time that the rods 86 are reciprocated vertically by the rocker arm 92. Arms 92 and 94 are operated in the proper sequence by rods 96 and 98, respectively, which are driven from the chasis of the system. The tweezers 82*a* and 82*b* are biased closed by springs 100*a* and 100*b*. The tweezers 82*a* and 82*b* are opened when a rod 112 moves plate 110 to the left so as to engage the end of a rod 106 and move collars 102*a* and 102*b* against the right-hand leg of the tweezers. The rod 106 is normally biased to the right by a spring 108** to permit the tweezers to close.

A guide 114 has inverted conically-shaped opening positioned above the chucks **34*a* and 34*b* to guide the ends of the lead wires into the chucks. Push rods 116*a* and 116*b* (not illustrated) are moved upwardly against arms 36*a* and 36*b*** to open the jaws of the respective chucks as the lead wires are inserted.

To summarize the operation of the wire feed mechanism 40, the escapements **76*a* and 76*b* are reciprocated once each index cycle to pass one lead wire 12 into the pickup positions, which are holes subject to a vacuum to hold the lead wires firmly in place. The rod 112 is reciprocated to the left so as to open the tweezers 82*a* and 82*b*. The rods 90 are then reciprocated to the left, when referring to FIG. 4, so that the tweezers 82*a* and 82*b* are aligned over the lead wires 12** located in the respective pickup positions. The rods 86 are then reciprocated downwardly so as to move the open tweezers 82*a* and 82*b* around the heads 16 of the respective lead wires 12, and the rod 112 then reciprocated back to the right to close the tweezers and grip the lead wires. Rods 86 are then raised to the full extent necessary to withdraw the lead wires from the apertures, then the rods 90 reciprocated to the right into alignment over the chucks 34*a* and 34*b* which are positioned at the wire feed station 40. The lead wires are then lowered through a guide 114 into the openings in the chuck 34. At the same time, the push rods 116*a* and 116*b* are released so as to slightly open the chuck 34*a* and facilitate insertion of the wire. The plate 110 is then moved back to the left in order to open the tweezers 82*a* and 82*b* and thus leave the lead wires 12 in the chucks at the same time that the rod 116 is again lowered to close the chuck on the lead wires. The link 32 is then indexed to the next position.

Each of the wire feed stations 41 and 42 is substantially identical to wire feed station 40 and accordingly is not herein described in detail. The three wire feed stations thus load three wires in each of the chucks 34*a* and 34*b* at three successive index positions of the chain.

As the chucks are indexed to the wire detect station 44, an arm supporting a set of three microswitches for each of the chucks 34*a* and 34*b* is lowered over the chucks. If any one of the three lead wires is missing from a chuck, the microswitch for that position will not be closed and a logic zero signal is set to the computer indicating that the full complement of three wires is not contained in the particular chuck 34*a* or 34*b*. The computer responds in a manner which will herafter be described in detail to disable all operations in connection with that particular chuck as it continues through the remainder of the fabrication cycle.

Next the chucks 34*a* and 34*b* are positioned at the glass feed stations 46*a* and 46*b*, respectively. The glass feed mechanism 46*a* is shown in FIGS. 6–8 and is comprised of a vibratory feeder bowl 120 which delivers the tubular glass rings 13 to the receiving slot 126 of a chuck 122*a* by means of a rail 124*a*. The chuck 122 has vacuum offices 124 around the periphery of a U-shaped receiving slot, and is slidably mounted on a rod 130 for reciprocal movement. Both vaccum chuck 122*a* and vacuum chuck 122*b* are moved by the same linkage including members 132, 134, 136, and 138. After the glass ring 13 has been positioned over the chuck 34*a*, a plunger 140*a* is lowered to push the ring from the chuck 122*a* and the vacuum to the chuck may be turned off to insure that the ring is not sucked back up by the chuck.

Either of the glass feed chucks 122*a* or 122*b* may be selectively disabled by a command signal from the computer to a pair of solenoids 142*a* and 142*b* (not illustrated). Upon actuation of solenoid 142*a*, a dog 144*a* is raised into position behind a hook 146*a* connected to the slide carriage 148*a* for the vacuum chuck 122*a*. The lost motion mechanism 150*a* permits the operating mechanism 132 to continue to operate chuck 122*b*. The glass feed station 46*b* has all of the parts that have been designated above by a reference numeral followed by the letter "*a*", and where shown are designated by the same reference numeral followed by the letter "*b*".

The chucks 34*a* and 34*b* are then indexed to a glass detect station 48 which is also an arm that carries a pair of limit switches. When the arm is mechanically lowered, the limit switches will be closed only if a glass ring 13 is in the proper position on the respective chucks 34*a* and 34*b*. If either of the rings is missing or improperly positioned, the microswitch will not be closed, indicating that the chuck is defectively loaded.

The chucks 34*a* and 34*b* are then indexed to the reject stations 50*a* and 50*b*, respectively. Reject station 50*a* is shown in detail in FIG. 9. A vacuum tube 150*a*, which is positioned above the chuck 34*a* disclosed at the station, is in communication with a receiving jar 152 (see FIG. 3*a*) which is subjected to a vacuum. A thin metal valve strip 154*a* normally closes the end of the vacuum tube 150*a*. The valve strip 154*a* is secured at one end to a crank arm 158*a* by a clamp 156*a*. The other end is connected to a spring 162*a* by a clamp 160*a*.

The crank arm 158*a* is pivoted in the counterclockwise direction by a solenoid 164*a* which pulls downwardly on a rod 166*a* when energized. A rocker arm 168*a* is pivotally mounted on a pin 170*a* and is operated by a cam follower 172*a* and a cam 174*a*. The cam 174*a* is mounted on the crank arm 158*a*. A spring 176*a* keeps the cam follower 172*a* in contact with the arm 174*a*. An adjusting screw 178*a* on the end of the rocker arm 168*a* is positioned to engage the arm 36*a* and move it upwardly so as to open the chuck 34*a* and release the lead wires 12 held therein. A second rocker arm 180*a* is pivotally mounted on pin 182*a* and has a cam follower 184*a* which rides on a cam 186*a*, also mounted on the bell crank 158. A spring 188*a* urges the cam follower 184*a* against the cam 186*a*.

When the solenoid 164*a* is actuated to pivot the bell crank 158*a* in the counterclockwise direction, the valve strip 154*a* is moved to the left so that an aperture (not illustrated) registers with the vacuum tue 150*a*. Upon the initial movement of cam 74, the chuck 34*a* is opened by the adjusting screw 178*a* striking the arm 36*a* to release the lead wires 12. Additional travel results in the arm 180*a* pivoting upwardly and engaging the lower ends of the lead wires 12 and lifting the lead wires and glass ring affirmatively into the opening of the vacuum tube 150 so that the entire contents of the chuck is sucked out and into the receiving jar 152. The solenoid is then de-energized and the spring 162*a* returns the valve strip 154*a* to the closed position preparatory to the next indexing cycle. An identical system is provided to empty the contents of selected ones of the chucks 34*b*.

The forming station 54 is shown in the detailed drawings of FIGS. 10 and 11. The forming station 54 includes a pair of complementing, horizontally moving dies 190 and 192, and a vertical die 194. An actuating rod 196 oscillates an arm 198 which is pivoted on the axle 200. Cranks 202 and 204 are operated by linkages 206 and 208 connected to the arm 198. The die members 190 and 192 are connected to slide members 210 and 212, respectively, which are operated from the arms 202 and 204 by connecting rods 214 and 216, respectively. The vertical die member 194 is mounted on a vertical slide 218. A cam follower 220 is mounted on the vertical slide 218 and follows the contour of the cam slot 222 cut in the arm 198.

As the cam 198 is pivoted in the counterclockwise direction, the slides 210 and 212 move together to press the dies 190 and 192 around the glass ring 13, and the vertical slide 118 is lowered to press the die 194 against the top of the glass to insure that it does not rise above the upper surfaces of the heads 16 of the lead wires. The forming station 56 is identical to the forming station 54 except for the shape of the dies. The two molding steps are desirable in order to reach the final shape of the glass body and insure a good mechanical hold on the lead wires.

The alloy station 58*a* is shown in detail in FIGS. 12 and 13. The semiconductor devices 20 are positioned on successive frames of a tape 250. The tape 250 includes a top string that is substantially identical to an 8 millimeter film and is indexed with precision to a predetermined pickup station by an indexing mechanism 252 that is substantially the same as that used to drive a motion picture film. Each frame of the top strip is cut out and the tape is backed by an upwardly facing strip of adhesive tape. The semiconductor chips 20 are precisely oriented in predetermined rotational position on the adhesive tape within each frame. The adhesive tape holds the chips in place, yet permits the chips to be picked from the tape by a vacuum needle.

The chips are transferred from the film strip 250 to the alloy station 58*a* by a turret mechanism indicated generally by the reference numeral 254. The turret mechanism has eight vacuum needle assemblies 256. Each vacuum needle 256 is mounted on an arm 258. Each arm 258 is slidably mounted for vertical movement on a pair of pins 260 shown in dotted outline in FIG. 13. The arms 258 are biased upwardly by springs 266. The pins 260 are in turn secured in brackets 262 which are mounted on a horizontally disposed annular plate 264.

The plate 264 is rigidly connected to a tubular shaft 268 which is indexed by the indexing mechanism 270 shown in FIG. 3*b* in synchronism with the indexing of the chain 32. The rotating shaft 268 is mounted on a fixed tubular shaft 272 by a bearing 274. A pair of support arms 374 are mounted on the stationary shaft 272, and a pair of rocker arms 276 are pivotally mounted on the end of the support arms 274. The housing 278 is mounted on extensions 280 of the arms 274. Spring 282 bias adjusting screws 284 downwardly against the upper end of a push rod 286. Adjusting screws 288 at the other ends of the arms 276 engage the striker plates 290 on the two arms 258 positioned over the tape 250 and over the chuck 34*a*. Thus when the push rod 286 is raised, only the two vacuum needles 256 aligned over the tape 250 and over chucks 34*a* are depressed against the tape 250 and against the head of a lead wire 12, while the other six needles 256 remain biased to the upward positions.

Air to the vacuum needles 256 is controlled by a rotary valving mechanism including a rotary valve plate 290 which is bolted to the plate 264, and a stationary valve plate 292 which is biased upwardly against the rotary valve plate 290 by a plurality of springs 294 which act against a support 295. A single port 296 is provided in the rotary valve plate 264 for each of the vacuum needles 256, and is in communication with the respective vacuum needles through flexible hoses 298. The stationary valve plate 294 has three separate ports around its periphery. One port (not illustrated) extends substantially 180° from the tape 250 to the chuck 34*a* and is continually in communication with a vacuum source. This port continually provides a vacuum to the needles 256 from the time that they arrive at the pickup station over the tape 250 until they approach the chuck 34*a*. As the needle approaches the chuck 34*a*, the port 296 transitions, without losing vacuum, to a second port 300. Air is supplied to the port 300 through fitting 301 and is pulsed by a solenoid valve so as to alternately change the pressure in the bonding needle from less than to greater than atmospheric pressure during the period when the vacuum needles are lowered. This insures that the chip is deposited at the bonding station, and also tends to scrub the chip in. A third port in stationary valve plate 292 also provides positive air pressure to the vacuum needles as they travel from chuck 34*a* back to the tape 250 to insure that a chip is not stuck on the tip of the needle. Additionally, a mechanical wiper can be provided to insure that the tip of the needle is free of unwanted chips.

A flame is directed onto the header assembly by a fixture 302 to heat the thin layer of gold on the back side of the chip 20 and the gold plated on the head of the lead wire to an alloy temperature.

The entire appartus illustrated in FIGS. 12 and 13 is mounted on an XY table which is controlled by manually operated ball screws. The position of the vacuum needles 256 can therefore be precisely set within relationship to the lead wire to which the semiconductor chip is to be bonded. Similarly, the indexing mechanism 252 for the tape 250 is mounted on an XY table the position of which is controlled by a pair of micrometers. The position of the tape 250 can be adjusted to achieve registry between the semiconductor chips and the vacuum needles 256. As mentioned, the chips 220 are mounted in predetermined rotational relationship on the tape 250 so that they are then in predetermined rotational position on the head of the lead wire when the alloy step is completed.

The alloy detector station 59 detects whether or not a semiconducor chip was successfully alloyed to the head of the lead 16. The sensitor conveniently comprises two-pass fiber optics bundle positioned to direct light onto an edge of the chip and simultaneously receive light reflected from the chip. The presence or absence of reflected light is then detected and amplified to provide a logic signal indicating the presence or absence of the chip.

The bonders 60*a*, 60*b*, 62*a* and 62*b* are described in detail in copending application Ser. No. (TI-3683), entitled "Automatic Semiconductor Bonding Machine", filed on even date herewith by Adams et al., and assigned to the assignee of the present application, which application is hereby incorporated by reference. The bonding machine so described automatically aligns an XY table carrying an opto-electric pattern recogniion system with the chip 12 alloyed on the head of the lead wire 72. Then a bonding needle is moved to a predetermined position with relationship to the XY table and is lowered against the chip to make a ball bond. The needle is then raised and moved a predetermined distance in a predetermined direction and is lowered to make a stitch bond on the head of another of the leads.

As previously mentioned, the bonding machine 60*b* connects jumper wires 22 to the header assemblies carried by the chucks 34*b*, and bonder 62*b* connects the jumper wires 24 to the headers carried by chucks 34*b*. Similarly, bonder 60*a* connects the jumper wire 22 and the bonder 62*a* connects jumper wires 24 to the header assemblies carried by the chucks 34*a*.

After the header assemblies are complete, the transfer mechanism 64b removes the devices from the chucks 34b, and transfer device 64a removes the devices from the chucks 34a. This is achieved by a pair of tweezer devices (not illustrated) similar to those used to load wire in the chucks originally, except that the tweezers are mounted on articulated arms. The header devices are transferred to small carrier blocks of different colors for each transfer arm. For example, header assemblies from the chucks 34a might be placed in black carrier blocks while those from chucks 34b might be placed in white carrier blocks. The carrier blocks are then comingled and transferred to a conventional test device 350 illustrated in FIG. 14 where tests are performed to detect opens and shorts. The result of the tests are fed back to the digital comparator 68 for statistical purposes as will presently be described. The use of black and white carrier blocks for the header assemblies from the chucks 34a and 34b provides a means for optically sensing which production lien made the unit being tested and this result is fed back to the digital computer 68 for statistical control purposes as will presently be described.

The mechanical apparatus 30 illustrated in FIGS. 3a and 3b is controlled by a digital computer 68 having input buffers 70 and output buffers 72. The computer receives signals from wire detector 44, glass detector 48, alloy detector 59, and from each of the bonders 60a, 60b, 62a, and 62b. Separate inhibit signals may be supplied to the "*a*" and "*b*" channels at the wire loading stations 40a–42a and 40b–42b the glass loading stations 46a and 46b, the reject stations 50a and 50b, alloy stations 58a and 58b, and to the bonders 60a, 62a, 60b and 62b for purposes which will presently be described.

The digital computer 68 is programmed as illustrated in FIG. 13. The digital computer has storage addresses programmed to define a pair of shift registers A and B represented in dotted outline. Each of the shift registers has a number of binary storage bits equal to the number of index positions in the complete loop of the chain 32. The logic inputs from detectors 44a, 48a and 59a are input to the bit positions of shift register A, corresponding the index positions of the detectors in the chain loop, and the logic outputs for detectors 44b, 48b and 59b are input to the same bit position of shift register B.

Assume now that the wire detector 44b detects that a lead wire 12 is missing from the chuck 34b that is then positioned at the wire detect station, a logic zero is introduced to shift register B at the bit position corresponding to the wire detector station. Each time the chain 32 is indexed, the logic zero is then shifted to the next bit in shift register B.

When the logic zero is shifted into the bit that represents the index position of glass feeder 46b, the glass feeder 46b is disabled so that no glass ring is placed on the chuck. Then when the logic zero reaches the bit representing reject station 50b, the reject system 50b is opened and all other parts that may be carried by the chuck are withdrawn. The chuck continues empty for the remainder of the chain cycle. When the logic zero is in the fifth bit position from that corresponding to alloy station 58b, the tape indexing mechanism 262 is disabled so that a chip is not made available to the vacuum needle 256 which would otherwise ultimately alloy a chip on the vacant chuck 34b. The bonders 60b and 62b are also disabled as the empty chuck is positioned at the respective bonding station. This is accomplished by disabling the "H" and "V" cam motors to prevent movement of the bonding needle. Finally the transfer mechanism 64b is disabled to prevent a faulty device from being transferred to the tester. This would occur only where failure was first detected at the alloy detector 59b. Any one of the detect stations similarly introduces a logic zero to the shift register when a defectively loaded chuck is detected, and all subsequent operation with respect to that chuck are disabled. The disabling of the various stations is done by the outputs from the digital computer 68 made through the output buffer 72.

In the event of a wire failure in any one of the bonders, the appropriate alloying unit 58a or 58b, glass feeder 46a or 46b or wire feeders 40a–42a or 40b–42b would be immediately disabled. In the event it is desired to stop production on either chuck line "*a*" or "*b*", the wire feeders for the particular chuck lines are merely disabled. Then the wire detector 44 begins shifting logic zeros into the appropriate shift register A or B with the result that the appropriate glass feeder, alloy station and bonders are successively disabled after all loaded chucks have passed, thus permitting the machine to automatically empty out those chucks which were already loaded with raw materials.

The digital computer 13 is also used for various bookkeeping and management functions in connection with the system. For example, the number of failures detected by the wire detector stations 44a and 44b, the glass detector stations 48a and 48b, and the alloy detector stations 59a and 59b are recorded by the computer. If the failure rate exceeds a predetermined percentage, the computer prints out a message to the operator so that precautionary measures can be taken to correct the deficiency and perhaps prevent a catastrophic failure. Similarly, the outputs from the tester 350 are tabulated so as to keep track of the efficiency of each of the four bonders.

The program for the digital computer 68 is represented in FIG. 13. First the program is entered in the core as indicated at step 400. The established limits for the number of failures of the various stations are then stored in the core. These limits represent percentages of failures which are considered catastrophic and result in the shut down of one of the production lines, as well as the limits which must be exceeded before a message indicating a potential failure is printed out. The computer then cycles through a start program question 402 until the program is manually started. When the program is started, the data in the input buffers 70 are loaded into the core of the computer at step 403. The shift registers A and B are then updated in accordance with the input words at step 404. The input words stored in core are then tested with respect to the words stored in memory which define failures to detect any failures at step 405. If one or more failures is detected, the status counters defined by address in the core which keep track of the number of failures are updated at step 406. Next the counts of the status counters are tested against the percentage limits programmed. If none of the limits set up in the program have been exceeded, the program proceeds to examine the shift registers A and B at step 408 and to modify the out words in the core at step 409 in accordance with the status of the shift register. These out words are then loaded into the output buffer at step 410 and the status of the output buffers controls the system during the remainder of the index cycle. If the count of one or more of the counters exceeded the established limit at step 407, the approproate message list is generated at step 411 and the out words in the core are modified at step 412 prior to loading the out words into the output buffer 72 at step 410. The words in the output buffer 72 then control the status of the system during the cycle. The messages in the output buffers are then printed out, one character at a time, at step 413 while continuously monitoring the index signal at step 414. As soon as the index signal indicates that the next index has been completed, the program exits the print out loop and proceeds to shift the shift registers A and B one bit at step 415 and returns to repeat the program steps 402–410. Steps 402 through 410 require only about 30 milliseconds, while the chain index cycle requires almost a full second. Thus the new outputs are stored in output buffers 72 very early in the cycle and control the operation of the system for the remainder of the cycle.

From the above description, it will be appreciated that a completely automatic system has been described for fabricating a header, alloying a semiconductor chip to the header, and interconnecting the chip and the leads with jumper wires. The resulting product shown in FIG. 1 can then be encapsulated in an epoxy by an injection molding process of the type known in the art. The machine is capable of producing completed header assemblies at a rate approaching seven thousand per hour with a percentage yield that exceeds previously employed methods and systems.

Although a preferred embodiment of the invention has been described in detail, it is to be understood that various changes, substitutions and alterations can be made therein without departing from the spirit and scope of the invention as defined by the appended claims.

What is claimed is:

1. In a process for fabricating a semiconductor device, the steps of:

successively indexing a plurality of header assemblies to an alloy station with each header assembly being oriented in a predetermined position relative to a first axis at the alloy station, successively indexing a plurality of semiconductor devices adhered to an adhesive tape to a delivery station in sequence with the indexing of the header assembler to the alloy station, each semiconductor device being oriented in a predetermined position relative to a second axis at the delivery station, transferring each semiconductor device from the delivery station to the header assembly at the alloy station by picking the transistor from the tape with a vacuum needle and moving the vacuum needle in a predetermined manner to the alloy station, and alloying the semiconductor device to the header assembly before releasing the semiconductor device from the vacuum needle.

2. The method for assembling a semiconductor device which comprises loading a plurality of lead wires on a chuck, detecting whether or not the lead wires have been properly placed on the chuck, preventing further operations on the lead wires if a lead wire has been improperly placed in the chuck, loading a preform of moldable insulating material on the chuck adjacent the lead wires if the lead wires have been properly placed, detecting whether or not the preform has been properly placed on the chuck, and preventing further operations on the lead wires and preform if the preform has been improperly placed on the chuck.

3. The method of claim 2 further characterized by ejecting the lead wires and preform if either has been improperly placed on the chuck.

4. The method of claim 2 further characterized by forming the preform around the lead wires to form a header if the preform has been properly placed on the chuck.

5. The method of claim 4 further characterized by alloying a semiconductor device to one of the lead wires of the header detecting whether or not the semiconductor device has been properly alloyed on the header, and preventing further operations on the header if the semiconductor has been improperly alloyed on the header.

* * * * *